(12) United States Patent
Daimon

(10) Patent No.: US 11,611,326 B2
(45) Date of Patent: Mar. 21, 2023

(54) ACOUSTIC WAVE DEVICE AND COMPOSITE FILTER DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 544 days.

(21) Appl. No.: 16/724,419

(22) Filed: Dec. 23, 2019

(65) Prior Publication Data

US 2020/0127638 A1    Apr. 23, 2020

Related U.S. Application Data

(63) Continuation of application No. PCT/JP2018/022522, filed on Jun. 13, 2018.

(30) Foreign Application Priority Data

Jun. 26, 2017 (JP) .............................. JP2017-124216

(51) Int. Cl.
*H03H 9/145* (2006.01)
*H01L 41/047* (2006.01)
(Continued)

(52) U.S. Cl.
CPC ........... *H03H 9/145* (2013.01); *H01L 41/047* (2013.01); *H03H 9/25* (2013.01); *H03H 9/54* (2013.01); *H03H 9/643* (2013.01)

(58) Field of Classification Search
CPC .............................. H03H 91/45; H01L 41/047
See application file for complete search history.

(56) References Cited

U.S. PATENT DOCUMENTS

2004/0108917 A1* 6/2004 Jian .................... H03H 9/02881
333/193
2004/0169570 A1* 9/2004 Yip ........................ H03H 9/643
333/195

(Continued)

FOREIGN PATENT DOCUMENTS

JP       2001-285012 A     10/2001
JP       2004-266827 A      9/2004
(Continued)

OTHER PUBLICATIONS

English Translation of JP 2014229961 (Year: 2014).*
Official Communication issued in International Patent Application No. PCT/JP2018/022522, dated Jul. 24, 2018.

*Primary Examiner* — Bryan P Gordon
(74) *Attorney, Agent, or Firm* — Keating & Bennett, LLP

(57) ABSTRACT

An acoustic wave device includes a piezoelectric substrate, an interdigital transducer (IDT) electrode provided on the piezoelectric substrate, and a pair of reflectors provided on both sides of the IDT electrode in a first direction on the piezoelectric substrate, the first direction being a propagation direction of an acoustic wave. The pair of reflectors include a plurality of electrode fingers and a plurality of electrode fingers, respectively, which extend in a second direction, the second direction being perpendicular to the first direction. The electrode finger widths of second end portions are greater than the electrode finger widths of first end portions. The electrode finger width at any given position in the electrode fingers is equal to or greater than the electrode finger width at a position closer than the given position to the first end portions.

17 Claims, 7 Drawing Sheets

(51) Int. Cl.
 *H03H 9/25* (2006.01)
 *H03H 9/54* (2006.01)
 *H03H 9/64* (2006.01)

(56) References Cited

U.S. PATENT DOCUMENTS

2014/0361850 A1* 12/2014 Inoue .................. H03H 9/6433
                                                    333/195
2017/0373663 A1* 12/2017 Kishimoto ......... H03H 9/02228
2018/0097508 A1*  4/2018 Iwamoto ................ H03H 9/132
2018/0287586 A1* 10/2018 Daimon .............. H01L 41/1873

FOREIGN PATENT DOCUMENTS

| JP | 2005-198020 A | 7/2005 |
| JP | 2014-192723 A | 10/2014 |
| JP | 2014-229961 A | 12/2014 |
| JP | 2015-177465 A | 10/2015 |
| WO | 2016/208446 A1 | 12/2016 |

* cited by examiner

ACOUSTIC WAVE DEVICE AND COMPOSITE FILTER DEVICE

CROSS REFERENCE TO RELATED APPLICATIONS

This application claims the benefit of priority to Japanese Patent Application No. 2017-124216 filed on Jun. 26, 2017 and is a Continuation Application of PCT Application No. PCT/JP2018/022522 filed on Jun. 13, 2018. The entire contents of each application are hereby incorporated herein by reference.

BACKGROUND

1. Technological Field

The present disclosure relates to an acoustic wave device and a composite filter device.

2. Description of the Related Art

Acoustic wave devices have widely been used as a component such as a filter in a cellular phone. International Publication No. 2016/208446 discloses filter devices as an example of the acoustic wave device. Each of the filter devices has a set of interdigital transducer (IDT) electrodes and a pair of reflectors disposed on both sides of the set of IDT electrodes in the propagation direction of an acoustic wave on a piezoelectric substrate formed by a high-acoustic-velocity support substrate, a low-acoustic-velocity film laminated on the high-acoustic-velocity support substrate, and a piezoelectric film laminated on the low-acoustic-velocity film.

Issues for the acoustic wave device arise from an unnecessary wave originating from the upper end of a stop band of reflectors (a response due to a stop band). A stop band is a region where an acoustic wave has a fixed wavelength because the acoustic wave is confined in a metal grating having a periodic structure. Although a stop band response also occurs in a filter device having an IDT electrode and reflectors disposed on a single-layer piezoelectric substrate, a stop band response of filter devices described in International Publication No. 2016/208446, in particular, is too large to be sufficiently suppressed and causes an issue of degraded attenuation characteristics. In addition, if one end of such a filter device is connected to one end of a second filter device to form a composite filter device, filter characteristics, such as an insertion loss, of the second filter device may be degraded.

SUMMARY OF THE DISCLOSURE

Preferred embodiments of the present invention provide acoustic wave devices and composite filter devices that are each able to significantly reduce or prevent a stop band response of reflectors.

An acoustic wave device according to a preferred embodiment of the present invention includes a piezoelectric substrate, an interdigital transducer (IDT) electrode provided on or above the piezoelectric substrate, and a pair of reflectors provided on both sides of the IDT electrode in a first direction on the piezoelectric substrate, the first direction being a propagation direction of an acoustic wave. Each of the pair of reflectors includes a plurality of electrode fingers extending in a second direction, the second direction being perpendicular or substantially perpendicular to the first direction, and each of the plurality of electrode fingers includes a first end portion located at one end in the second direction and a second end portion located at the other end in the second direction. An electrode finger width of the second end portion of each of the plurality of electrode fingers is greater than the electrode finger width of the first end portion, the electrode finger width being a size of each of the plurality of the electrode fingers in the first direction, and the electrode finger width at any given position in each of the plurality of electrode fingers is equal to or greater than the electrode finger width at a position closer than the given position to the first end portion.

In an acoustic wave device according to a preferred embodiment of the present invention, the electrode finger width of each of the plurality of electrode fingers continuously increases from the first end portion to the second end portion.

In an acoustic wave device according to a preferred embodiment of the present invention, the electrode finger width of each of the plurality of electrode fingers is stepwise increased from the first end portion to the second end portion.

In an acoustic wave device according to a preferred embodiment of the present invention, a position of the first end portion with respect to a position of the second end portion in the second direction is opposite for the electrode fingers that are adjacent to each other. In this case, when reflectors are formed by using a lift-off method, resist patterns are easily removed, which leads to significantly improved lift-off operation, and pattern formation of reflectors is unlikely to fail.

In an acoustic wave device according to a preferred embodiment of the present invention, a position of the first end portion with respect to a position of the second end portion in the second direction is the same or substantially the same for the electrode fingers that are adjacent to each other.

In an acoustic wave device according to a preferred embodiment of the present invention, the IDT electrode includes a first busbar and a second busbar that face each other and that extend in a direction inclined with respect to the first direction, and each of the pair of reflectors includes a first busbar and a second busbar that face each other, that are connected to the plurality of electrode fingers, and that extend in a direction inclined with respect to the first direction.

In an acoustic wave device according to a preferred embodiment of the present invention, the IDT electrode includes a first busbar and a second busbar that face each other, a plurality of first electrode fingers connected to the first busbar at one end of each of the plurality of first electrode fingers, and a plurality of second electrode fingers that are connected to the second busbar at one end of each of the plurality of second electrode fingers and that interdigitate with the plurality of first electrode fingers. The IDT electrode includes an overlap area in which the plurality of first electrode fingers and the plurality of second electrode fingers overlap in the first direction, and the overlap area includes a central area located in a central portion in the second direction. The overlap area includes a first low-acoustic-velocity area located on the first busbar side of the central area and a second low-acoustic-velocity area located on the second busbar side of the central area, and an acoustic velocity in the first low-acoustic-velocity area and an acoustic velocity in the second low-acoustic-velocity area are lower than an acoustic velocity in the central area. The IDT electrode includes a first high-acoustic-velocity area and a second high-acoustic-velocity area, and an acoustic velocity is higher in the first and second high-acoustic-velocity areas than in the central area. The first high-acoustic-velocity area is located on an outer side of the first low-acoustic-velocity area in the second direction, and the second high-acoustic-velocity area is located on an outer side of the second low-acoustic-velocity area in the second direction. In this case, a spurious mode due to a higher-order transverse mode is able to be significantly reduced or prevented, and the energy of the acoustic wave can be confined.

In an acoustic wave device according to a preferred embodiment of the present invention, the piezoelectric substrate includes a piezoelectric layer including a piezoelectric material, a low-acoustic-velocity layer on or above which the piezoelectric layer is laminated and in which a bulk wave propagates at a lower acoustic velocity than an acoustic velocity of an acoustic wave propagating in the piezoelectric layer, and a high-acoustic-velocity layer on or above which the low-acoustic-velocity layer is laminated and in which a bulk wave propagates at a higher acoustic velocity than the acoustic velocity of the acoustic wave propagating in the piezoelectric layer, and the IDT electrode and the pair of reflectors are provided on the piezoelectric layer. In this case, the energy of the acoustic wave can efficiently be confined on the piezoelectric layer side.

A composite filter device according to a preferred embodiment of the present invention includes an antenna terminal that is electrically connectable to an antenna and a plurality of filter devices that are electrically connected to the antenna terminal, and at least one filter device of the plurality of filter devices includes an acoustic wave device according to a preferred embodiment of the present invention.

In a composite filter device according to a preferred embodiment of the present invention, the at least one filter device, which includes the acoustic wave device, is a ladder filter that includes a plurality of acoustic wave resonators, and the acoustic wave device is an acoustic wave resonator located closest to the antenna terminal in the filter device among the plurality of acoustic wave resonators. In this case, an effect of a stop band response on another filter device electrically connected to an antenna terminal, to which the filter device that includes an acoustic wave device according to a preferred embodiment of the present invention is connected, is able to be significantly reduced or prevented.

According to preferred embodiments of the present invention, acoustic wave devices and composite filter devices that are each able to significantly reduce or prevent a stop band response of reflectors can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described in detail with reference to the drawings.

It is to be noted that the preferred embodiments are described in the specification for illustrative purposes and that partial substitutions or combinations of configurations are feasible in different preferred embodiments.

Figure 1:
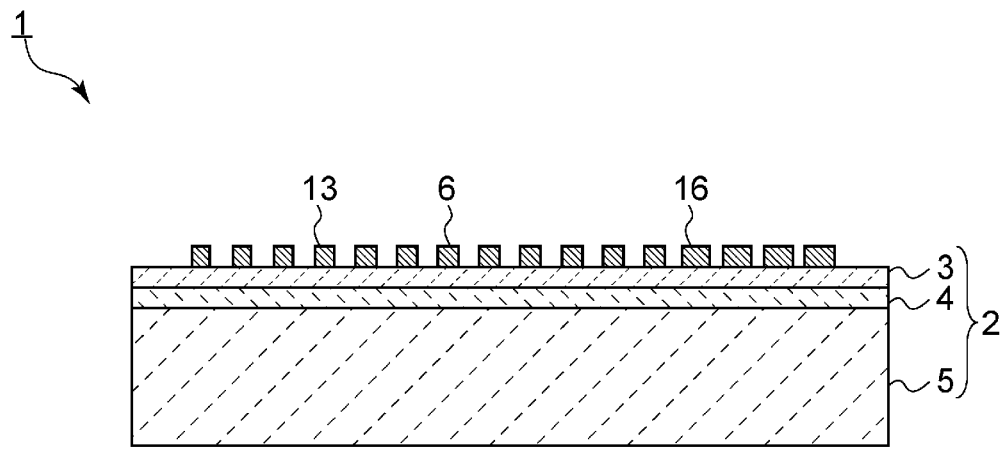
FIG. 1 is a cross-sectional view of an acoustic wave device according to a first preferred embodiment of the present invention.

FIG. 1 is a cross-sectional view of an acoustic wave device according to a first preferred embodiment of the present invention. FIG. 1 is a cross-sectional view taken along line I-I of FIG. 2, which is described below.

An acoustic wave device 1 includes a piezoelectric substrate 2. An interdigital transducer (IDT) electrode 6 is provided on the piezoelectric substrate 2. An alternating current voltage applied to the IDT electrode 6 excites an acoustic wave. The propagation direction of the acoustic wave is denotes as a first direction x, and a pair of reflectors 13 and 16 are provided on both sides of the IDT electrode 6 in the direction x. Thus, the acoustic wave device 1 according to the first preferred embodiment is an acoustic wave resonator.

The piezoelectric substrate 2 is a laminated substrate having a high-acoustic-velocity layer 5, a low-acoustic-velocity layer 4, and a piezoelectric layer 3, which are laminated. The piezoelectric layer 3 is preferably made of a piezoelectric single crystal, for example, $LiNbO_3$ or $LiTaO_3$, or appropriate piezoelectric ceramics.

The low-acoustic-velocity layer 4 is preferably made of a material mainly including, for example, glass, silicon oxide, silicon oxynitride, tantalum oxide, or a compound formed by adding fluorine, carbon, or boron to silicon oxide. The low-acoustic-velocity layer 4 may include a material having a relatively low acoustic velocity, namely a material in which a bulk wave propagates at a lower acoustic velocity than the acoustic velocity of the acoustic wave that propagates in the piezoelectric layer 3.

The high-acoustic-velocity layer 5 is preferably made of a material mainly including, for example, aluminum nitride, aluminum oxide, silicon carbide, silicon oxynitride, silicon, diamond-like carbon (DLC) film, or diamond. The high-acoustic-velocity layer 5 may include a material having a relatively high acoustic velocity, namely a material in which a bulk wave propagates at a higher acoustic velocity than the acoustic velocity of the acoustic wave that propagates in the piezoelectric layer 3.

In the first preferred embodiment, the piezoelectric layer 3 and the low-acoustic-velocity layer 4 are a piezoelectric film and a low-acoustic-velocity film, respectively, which have a thin film structure. In contrast, the high-acoustic-velocity layer 5 is a high-acoustic-velocity substrate having a substrate structure. The high-acoustic-velocity layer 5 may be a high-acoustic-velocity film, or a high-acoustic-velocity film laminated on a support substrate. Instead of the laminated substrate described above, the piezoelectric substrate 2 may be a piezoelectric substrate including a piezoelectric material.

Since the piezoelectric substrate 2 has a laminated structure including the high-acoustic-velocity layer 5, the low-acoustic-velocity layer 4, and the piezoelectric layer 3, which are laminated, the energy of the acoustic wave can efficiently be confined on the piezoelectric layer 3 side.

The IDT electrode 6, the reflector 13, and the reflector 16 are provided on the piezoelectric layer 3. The IDT electrode 6 and the pair of reflectors 13 and 16 will be described in detail below.

Figure 2:
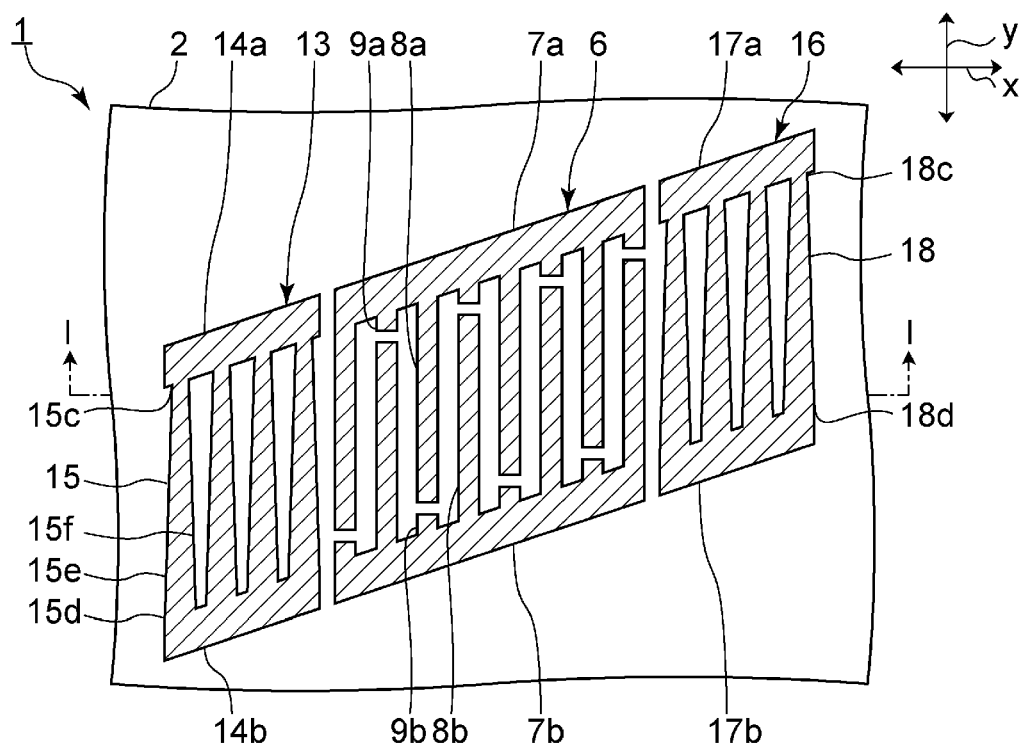
FIG. 2 is a plan view depicting an IDT electrode, reflectors, and the surrounding region according to the first preferred embodiment of the present invention.

FIG. 2 is a plan view depicting the IDT electrode, the reflectors, and the surrounding region according to the first preferred embodiment. FIG. 2 depicts the IDT electrode and the reflectors, which are emphasized by hatching. Wiring except the IDT electrode and the reflectors is omitted. Each plan view described below is similarly depicted.

The IDT electrode 6 includes a first busbar 7a and a second busbar 7b, which face each other. The IDT electrode 6 includes a plurality of first electrode fingers 8a, and one end of each of the plurality of first electrode fingers 8a is connected to the first busbar 7a. Further, the IDT electrode 6 includes a plurality of second electrode fingers 8b, and one end of each of the plurality of second electrode fingers 8b is connected to the second busbar 7b. The direction perpendicular or substantially perpendicular to the first direction x is denoted as a second direction y, and the plurality of first electrode fingers 8a and the plurality of second electrode fingers 8b extend in the second direction y. The plurality of first electrode fingers 8a and the plurality of second electrode fingers 8b interdigitate with each other. The IDT electrode 6 includes an overlap area in which the first electrode fingers 8a and the second electrode fingers 8b overlap in the first direction x.

The IDT electrode 6 includes a plurality of first dummy electrode fingers 9a. One end of each of the plurality of first dummy electrode fingers 9a is connected to the first busbar 7a, and each of the plurality of first dummy electrode fingers 9a faces one of the plurality of second electrode fingers 8b with a gap provided therebetween. The IDT electrode 6 includes a plurality of second dummy electrode fingers 9b. One end of each of the plurality of second dummy electrode fingers 9b is connected to the second busbar 7b, and each of the plurality of second dummy electrode fingers 9b faces one of the plurality of first electrode fingers 8a with a gap provided therebetween. The IDT electrode 6 may not include the first dummy electrode fingers 9a and the second dummy electrode fingers 9b.

The first busbar 7a and the second busbar 7b extend in a direction inclined with respect to the first direction x. An angle of inclination of the first busbar 7a and the second busbar 7b with respect to the first direction x is not specified in particular and is preferably equal to about 7.5°, for example, in the first preferred embodiment. The first busbar 7a and the second busbar 7b may extend parallel or substantially parallel to the first direction x.

The reflector 13 includes a first busbar 14a and a second busbar 14b, which face each other. The first busbar 14a and the second busbar 14b extend in a direction inclined with respect to the first direction x. The first busbar 14a and the second busbar 14b may extend parallel or substantially parallel to the first direction x.

The reflector 13 includes a plurality of electrode fingers 15 connected to the first busbar 14a and the second busbar 14b. The direction perpendicular or substantially perpendicular to the first direction x is denoted as the second direction y, and the plurality of electrode fingers 15 extend in the second direction y. In the present specification, an electrode finger of a reflector is assumed to extend in the second direction y if the electrode finger includes a portion that connects a first busbar and a second busbar and that extends in the second direction y.

Each of the plurality of electrode fingers 15 includes a first end portion 15c located at one end in the second direction y and a second end portion 15d located at the other end in the second direction y. In the first preferred embodiment, the first end portion 15c of each of the electrode fingers 15 is an end portion located on the first busbar 14a side, and the second end portion 15d is an end portion located on the second busbar 14b side.

An electrode finger width is defined as the size of each of the electrode fingers 15 in the first direction x, and the electrode finger width of the second end portion 15d of each of the electrode fingers 15 is greater than the electrode finger width of the first end portion 15c. Further, the electrode finger width of a portion located at any given position between the first end portion 15c and the second end portion 15d of each of the electrode fingers 15 is greater than the electrode finger width of a portion located at a position closer than the given position to the first end portion 15c. More specifically, the electrode finger width of the reflector 13 continuously increases from the first end portion 15c to the second end portion 15d in the first preferred embodiment. Each of the electrode fingers 15 includes a first side portion 15e and a second side portion 15f, which partially define the outer perimeter of the electrode finger 15 in plan view and connect the first end portion 15c and the second end portion 15d. The first side portion 15e and the second side portion 15f each extend in a direction inclined with respect to the second direction y. It is sufficient that at least one of the first side portion 15e and the second side portion 15f extends in a direction inclined with respect to the second direction y. The first side portion 15e or the second side portion 15f may include a step, and each of the electrode fingers 15 may include a portion in which the electrode finger width is stepwise increased.

As depicted in FIG. 2, the position of the first end portion 15c with respect to the position of the second end portion 15d in the second direction y is the same or substantially the same for adjacent electrode fingers 15. Accordingly, the reflector includes the adjacent electrode fingers 15 whose electrode finger widths increase in the same or substantially the same direction.

Similarly, the reflector 16 also includes a first busbar 17a, a second busbar 17b, and a plurality of electrode fingers 18. Each of the plurality of electrode fingers 18 includes a first end portion 18c connected to the first busbar 17a and a second end portion 18d connected to the second busbar 17b. The reflector 16 is similarly structured to the reflector 13.

The IDT electrode 6 and the pair of reflectors 13 and 16 may include a laminated metal film in which a plurality of metal layers are laminated or may include a single-layer metal film. The IDT electrode 6 and the pair of reflectors 13 and 16 can be formed by using, for example, a lift-off method.

A feature of the first preferred embodiment is that each of the electrode fingers 15 of the reflector 13 continuously increases in width from the first end portion 15c to the second end portion 15d, and each of the electrode fingers 18 of the reflector 16 continuously increases in width from the first end portion 18c to the second end portion 18d. This feature is able to significantly reduce or prevent a stop band response of the reflector 13 and the reflector 16. The first preferred embodiment and a first comparative example are compared with each other, and the significant reduction in or the prevention of a stop band response is described below.

As mentioned above, a stop band response is an unnecessary wave originating from the upper end of a stop band (a region where an acoustic wave has a fixed wavelength because the acoustic wave is confined in a metal grating having a periodic structure). An acoustic wave device according to the first comparative example differs from the acoustic wave device according to the first preferred embodiment in that the electrode finger widths of reflectors do not change in the second direction y.

An acoustic wave device having a structure according to the first preferred embodiment and an acoustic wave device according to the first comparative example are fabricated. The design parameters of the acoustic wave devices are listed in Table 1 below. An overlap width is defined as the length of the overlap area of an IDT electrode in the second direction y. Return losses of the acoustic wave devices are measured. The result is depicted in FIG. 3.

TABLE 1

|  | First preferred embodiment | First comparative example |
|---|---|---|
| Wavelength of IDT electrode (μm) | 1.5 | 1.5 |
| Overlap width (μm) | 30 | 30 |
| Number of pairs of electrode fingers of IDT electrode (pairs) | 100 | 100 |
| Duty ratio of IDT electrode | 0.5 | 0.5 |
| Wavelength of reflector (μm) | 1.5 | 1.5 |
| Number of electrode fingers of reflector | 41 | 41 |
| Electrode finger width of first end portion of electrode finger of reflector (μm) | 0.154 | 0.375 |
| Electrode finger width of second end portion of electrode finger of reflector (μm) | 0.455 | 0.375 |

Figure 3:
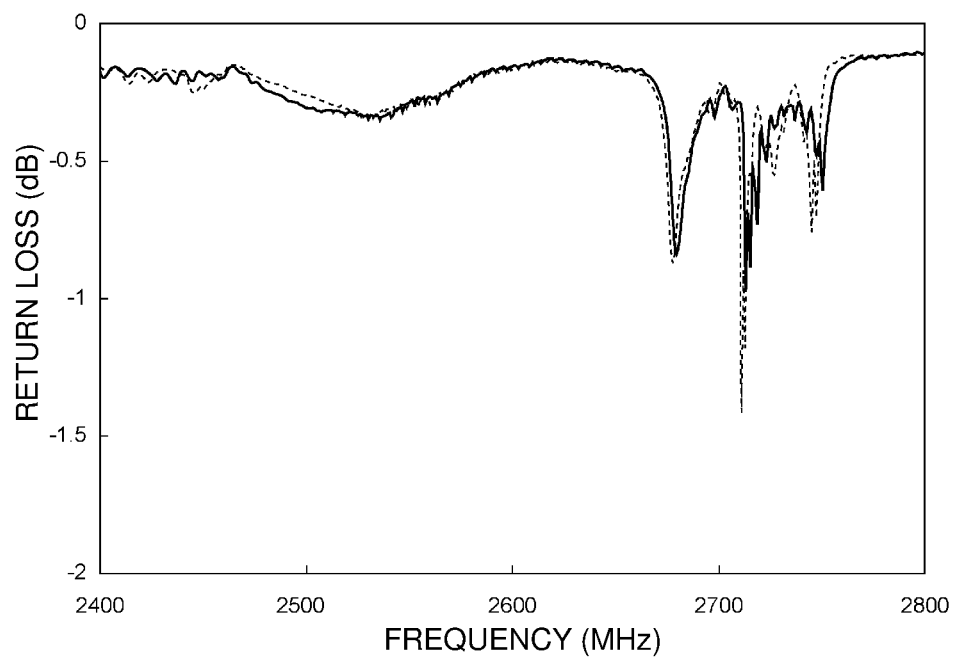
FIG. 3 depicts a return loss of an acoustic wave device according to the first preferred embodiment of the present invention and a return loss of an acoustic wave device according to a first comparative example.

FIG. 3 depicts a return loss of the acoustic wave device according to the first preferred embodiment and a return loss of the acoustic wave device according to the first comparative example. The solid line indicates the result for the first preferred embodiment, and the broken line indicates the result for the first comparative example.

It can be seen that a large stop band response appears in a range of about 2700 MHz to about 2750 MHz for the first comparative example. In contrast, it can be seen that a stop band response is small for the first preferred embodiment.

As depicted in FIG. 2, the first side portions 15e and the second side portions 15f of the electrode fingers 15 of the reflector 13 each extend in a direction inclined with respect to the second direction y in the first preferred embodiment. Accordingly, the acoustic wave excited in the IDT electrode 6 is reflected at different positions in each portion of the electrode fingers 15 in the second direction y. A similar description also applies to the electrode fingers 18 of the reflector 16. This feature can produce a reflection state of the acoustic wave in which a stop band response is reduced. Accordingly, the stop band response is able be to significantly reduced or prevented as depicted in FIG. 3.

If W1 is defined as the electrode finger width of the first end portion 15c of each of the electrode fingers 15 and W2 is defined as the electrode finger width of the second end portion 15d, W1/W2 is preferably equal to about 0.28 or more and equal to about 0.82 or less, for example. In this case, a stop band response is able to be significantly reduced or prevented. More preferably, W1/W2 is equal to about 0.43 or more and equal to about 0.54 or less, for example. In this case, the reflector 13 is easily formed, and a stop band response is able to be significantly reduced or prevented.

Figure 4:
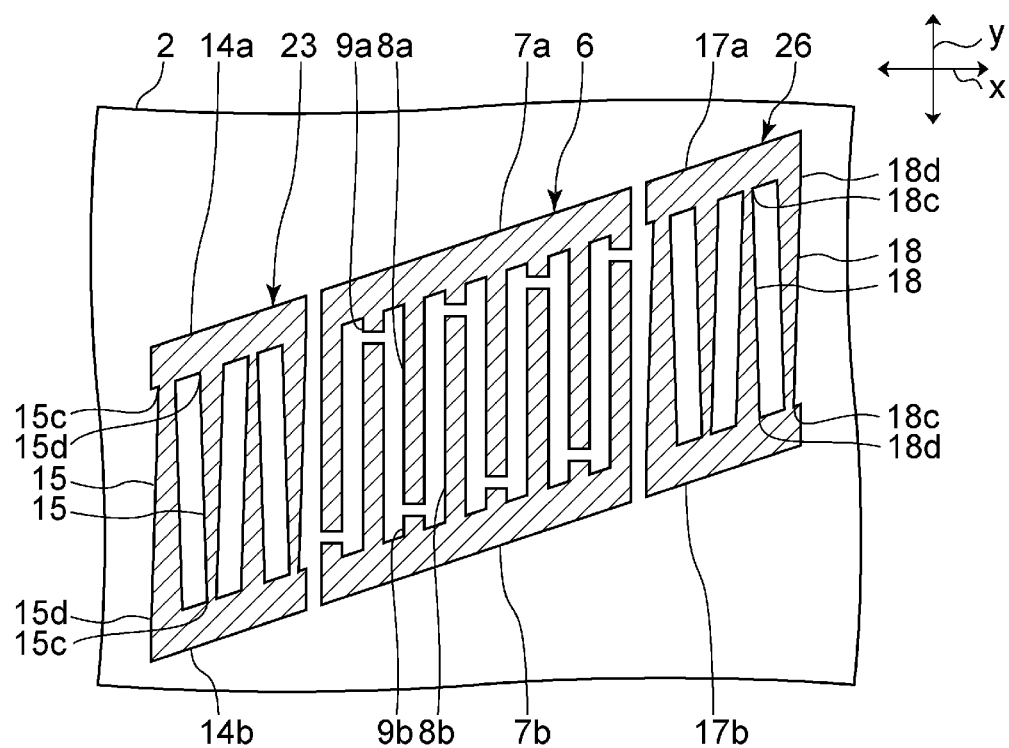
FIG. 4 is a plan view depicting an IDT electrode, reflectors, and the surrounding region according to a second preferred embodiment of the present invention.

FIG. 4 is a plan view depicting an IDT electrode, reflectors, and the surrounding region according to a second preferred embodiment of the present invention.

The second preferred embodiment differs from the first preferred embodiment in that the position of the first end portion 15c with respect to the position of the second end portion 15d in the second direction y is opposite for adjacent electrode fingers 15 of a reflector 23. In the reflector 23, one of the electrode fingers 15 that includes the first end portion 15c located on the first busbar 14a side and one of the electrode fingers 15 that includes the second end portion 15d located on the first busbar 14a side are arranged alternately. Directions in which the electrode finger width increases are opposite for adjacent electrode fingers 15. A similar description also applies to a reflector 26. The acoustic wave device according to the second preferred embodiment has a structure similar to the structure of the acoustic wave device 1 according to the first preferred embodiment except the above feature.

Figure 5:
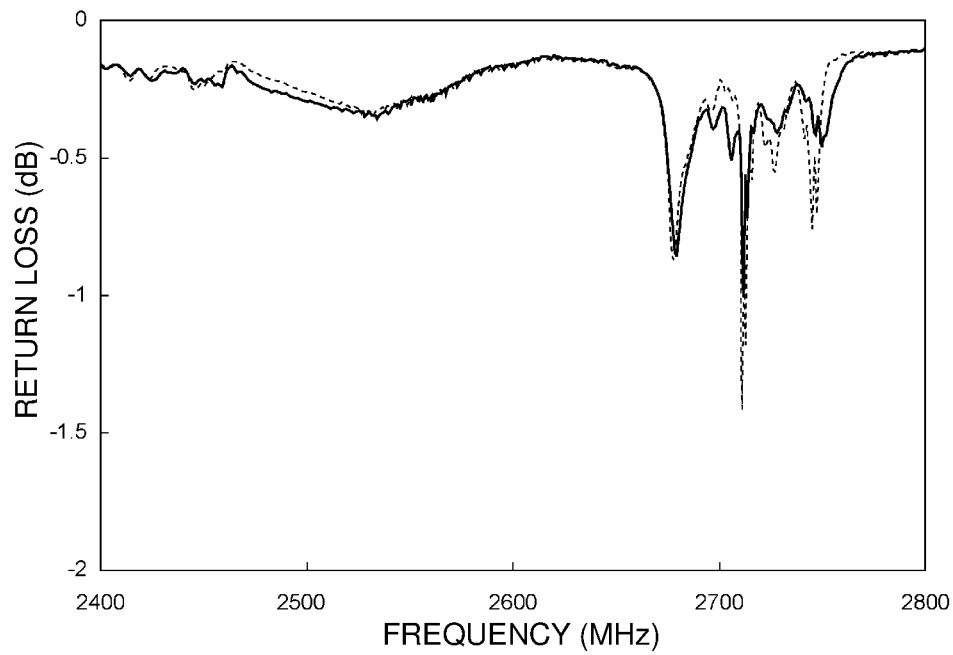
FIG. 5 depicts a return loss of an acoustic wave device according to the second preferred embodiment of the present invention and a return loss of an acoustic wave device according to the first comparative example.

FIG. 5 depicts a return loss of the acoustic wave device according to the second preferred embodiment and a return loss of the acoustic wave device according to the first comparative example. The solid line indicates the result for the second preferred embodiment, and the broken line indicates the result for the first comparative example. The acoustic wave device according to the first comparative example depicted in FIG. 5 is the same or substantially the same as the acoustic wave device according to the first comparative example depicted in FIG. 3.

As depicted in FIG. 5, it can be seen that a stop band response for the second preferred embodiment is smaller than a stop band response for the first comparative example.

As in the first preferred embodiment, the IDT electrode 6, the reflector 23, and the reflector 26 depicted in FIG. 4 can be formed by using, for example, a lift-off method. In a lift-off method, a resist pattern is formed on the piezoelectric substrate 2 by using a photolithography method. Then, a metal film for the IDT electrode 6, the reflector 23, and the reflector 26 is formed on the resist pattern. Next, the resist pattern is removed together with the metal film, which is formed on the resist pattern. The IDT electrode 6, the reflector 23, and the reflector 26 can be formed in this way.

The reflector 23 includes a plurality of openings surrounded by the first busbar 14a, the second busbar 14b, and the plurality of electrode fingers 15. The width of each of the openings is defined as the size of the opening in the first direction x. In the second preferred embodiment, as described above, the directions in which the electrode finger width increases are opposite for adjacent electrode fingers 15. Accordingly, the widths of the openings are large both on the first busbar 14a side and on the second busbar 14b side. Thus, when the reflector 23 is formed, resist patterns corresponding to the openings are easily removed, which leads to a significantly improved lift-off operation, and pattern formation is unlikely to fail. A similar description also applies to the reflector 26.

Figure 6:
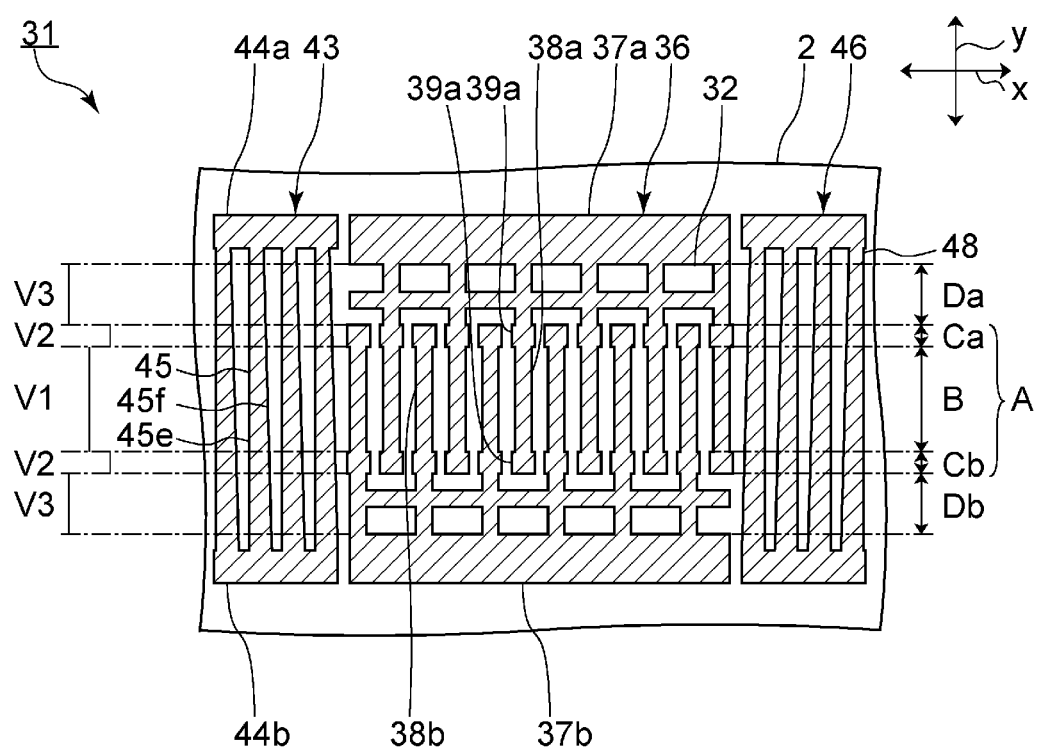
FIG. 6 is a plan view depicting an IDT electrode, reflectors, and the surrounding region according to a third preferred embodiment of the present invention.

FIG. 6 is a plan view depicting an IDT electrode, reflectors, and the surrounding region according to a third preferred embodiment of the present invention.

An acoustic wave device 31 according to the third preferred embodiment is an acoustic wave resonator that uses piston modes. A first busbar 37a and a second busbar 37b of an IDT electrode 36 extend parallel or substantially parallel to the first direction x.

An overlap area A of the IDT electrode 36 includes a central area B, which is located in the central portion in the second direction y. A first low-acoustic-velocity area Ca and a second low-acoustic-velocity area Cb, in which the acoustic velocity is lower than in the central area B, are located at positions including both end portions of the overlap area A in the second direction y. The first low-acoustic-velocity area Ca is located on the first busbar 37a side of the central area B. The second low-acoustic-velocity area Cb is located on the second busbar 37b side of the central area B.

Each first electrode finger 38a includes wide portions 39a each of which has the electrode finger width greater than the electrode finger width of other portion. A wide portion 39a is located on the first busbar 37a side of the central area B, and the other wide portion 39a is located on the second busbar 37b side of the central area B. A similar description also applies to each second electrode finger 38b. In this way, the acoustic velocity in the first low-acoustic-velocity area Ca and the second low-acoustic-velocity area Cb is set to be lower than the acoustic velocity in the central area B. The structure of the first low-acoustic-velocity area Ca and the structure of the second low-acoustic-velocity area Cb are not limited to the structure described above. For example, a mass-adding film may be provided on the first electrode fingers 38a and the second electrode fingers 38b to reduce the acoustic velocity.

A first high-acoustic-velocity area Da and a second high-acoustic-velocity area Db, in which the acoustic velocity is higher than in the central area B, are provided in the IDT electrode 36. The first high-acoustic-velocity area Da is located on the outer side of the first low-acoustic-velocity area Ca in the second direction y. The second high-acoustic-velocity area Db is located on the outer side of the second low-acoustic-velocity area Cb in the second direction y.

More specifically, the first busbar 37a includes a plurality of openings 32 aligned in the first direction x. The first high-acoustic-velocity area Da is an area ranging from a gap region, which is located between the second electrode fingers 38b and the first busbar 37a, to the openings 32. Each of the openings 32 is located opposite one of the second electrode fingers 38b in the second direction y and is not provided on an extended line of any of the first electrode fingers 38a in the second direction y. The location of each of the openings 32 is not limited to the position described above.

In the area where the plurality of openings 32 are provided, a metal film for the IDT electrode 36 is provided only on the extended lines of the first electrode fingers 38a in the second direction y. Only the plurality of first electrode fingers 38a are provided in the gap region, which is located between the second electrode fingers 38b and the first busbar 37a. Accordingly, the average acoustic velocity in the first high-acoustic-velocity area Da is higher than the acoustic velocity in the central area B.

The openings 32 are not necessarily required in the first busbar 37a, and the first high-acoustic-velocity area Da may be provided only by the gap region, which is located between the second electrode fingers 38b and the first busbar 37a.

The second high-acoustic-velocity area Db, which is located on the outer side of the second low-acoustic-velocity area Cb in the second direction y, is also similarly configured as the first high-acoustic-velocity area Da. If V1 is defined as the acoustic velocity in the central area B, V2 is defined as the acoustic velocity in the first low-acoustic-velocity area Ca and in the second low-acoustic-velocity area Cb, and V3 is defined as the acoustic velocity in the first high-acoustic-velocity area Da and in the second high-acoustic-velocity area Db, the relationship between the acoustic velocities $V2<V1<V3$ holds. This relationship is depicted in FIG. 6. The acoustic velocity increases from right to left in the relationship between the acoustic velocities V1 to V3 depicted in FIG. 6.

Since the central area B, the first low-acoustic-velocity area Ca, and the first high-acoustic-velocity area Da are arranged in this order and the central area B, the second low-acoustic-velocity area Cb, and the second high-acoustic-velocity area Db are arranged in this order in the acoustic wave device 31, a spurious mode due to a higher-order transverse mode is able to be significantly reduced or prevented, and the energy of the acoustic wave can be confined.

A first busbar 44a and a second busbar 44b of a reflector 43 extend parallel or substantially parallel to the first direction x. A first side portion 45e of each electrode finger 45 extends parallel or substantially parallel to the second direction y, and a second side portion 45f extends in a direction inclined with respect to the second direction y. Adjacent electrode fingers 45 have the same or substantially the same direction in which the electrode finger width increases. A reflector 46 is formed similarly to the reflector 43.

Since the reflector 43 and the reflector 46 have the structure described above, a stop band response of the reflector 43 and the reflector 46 is able to be significantly reduced or prevented in the third preferred embodiment as in the first preferred embodiment. The third preferred embodiment and a second comparative example are compared with each other, and the significant reduction in or the prevention of a stop band response is described below.

An acoustic wave device according to the second comparative example differs from the acoustic wave device according to the third preferred embodiment in that the electrode finger widths of reflectors do not change in the second direction y.

An acoustic wave device having a structure according to the third preferred embodiment and an acoustic wave device according to the second comparative example are fabricated. The design parameters of the acoustic wave devices are listed in Table 2 below. Return losses of the acoustic wave devices are measured. The result is depicted in FIG. 7.

TABLE 2

|  | Third preferred embodiment | Second comparative example |
|---|---|---|
| Wavelength of IDT electrode (μm) | 1.5 | 1.5 |
| Overlap width (μm) | 30 | 30 |
| Number of pairs of electrode fingers of IDT electrode (pairs) | 100 | 100 |
| Duty ratio of IDT electrode | 0.45 | 0.45 |
| Wavelength of reflector (μm) | 1.5 | 1.5 |
| Number of electrode fingers of reflector | 41 | 41 |
| Electrode finger width of first end portion of electrode finger of reflector (μm) | 0.154 | 0.375 |
| Electrode finger width of second end portion of electrode finger of reflector (μm) | 0.455 | 0.375 |

Figure 7:
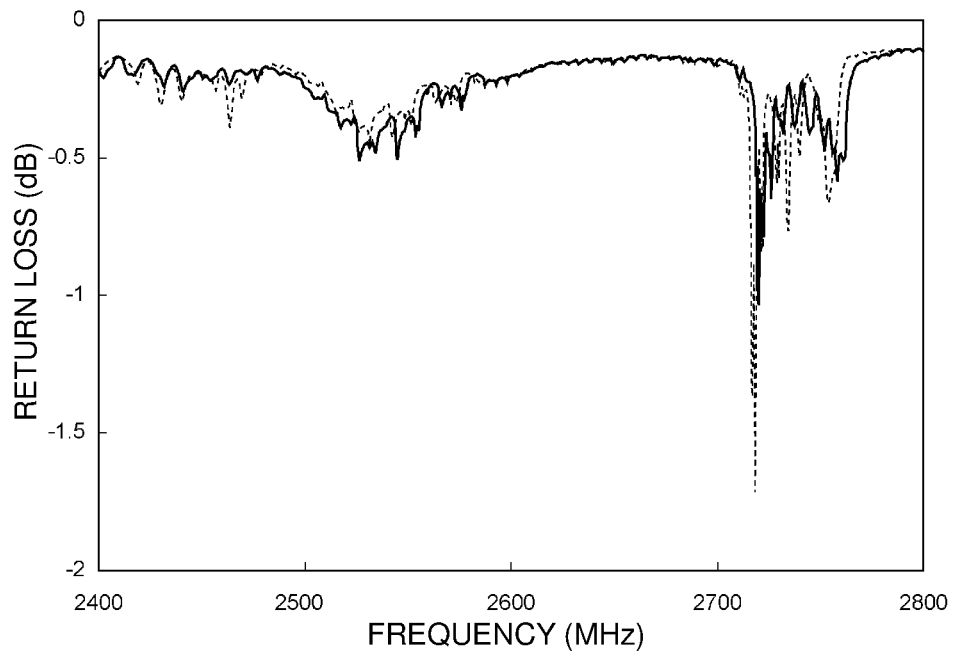
FIG. 7 depicts a return loss of an acoustic wave device according to the third preferred embodiment of the present invention and a return loss of an acoustic wave device according to a second comparative example.

FIG. 7 depicts a return loss of the acoustic wave device according to the third preferred embodiment and a return loss of the acoustic wave device according to the second comparative example. The solid line indicates the result for the third preferred embodiment, and the broken line indicates the result for the second comparative example.

It can be seen that a large stop band response appears in a range of about 2700 MHz to about 2770 MHz for the second comparative example. In contrast, it can be seen that a stop band response is small for the third preferred embodiment.

As depicted in FIG. 6, according to the third preferred embodiment, the reflector 43 is located so that the second side portions 45f of the electrode fingers 45 are located on the IDT electrode 36 side, the second side portions 45f extending in a direction inclined with respect to the second direction y. The reflector 46 is also located so that side portions of electrode fingers 48, the side portions extending in a direction inclined with respect to the second direction y, are located on the IDT electrode 36 side. The orientations in which the reflector 43 and the reflector 46 are provided are not limited to the orientations described above. For example, the reflector 43 may be provided so that the first side portions 45e extending parallel or substantially parallel to the second direction y are located on the IDT electrode 36 side.

Figure 8:
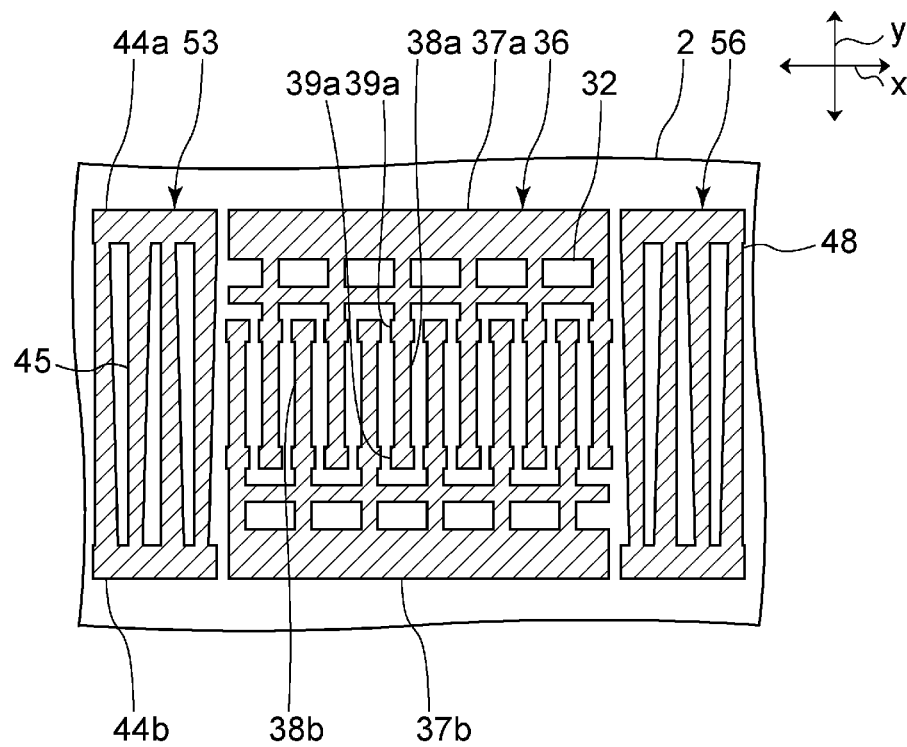
FIG. 8 is a plan view depicting an IDT electrode, reflectors, and the surrounding region according to a fourth preferred embodiment of the present invention.

FIG. 8 is a plan view depicting an IDT electrode, reflectors, and the surrounding region according to a fourth preferred embodiment of the present invention.

The fourth preferred embodiment differs from the third preferred embodiment in that directions in which the electrode finger width increases are opposite for adjacent electrode fingers 45 of a reflector 53 and directions in which the electrode finger width increases are opposite for adjacent electrode fingers 48 of a reflector 56. An acoustic wave device according to the fourth preferred embodiment has a structure similar to the structure of the acoustic wave device 31 according to the third preferred embodiment except the above feature.

Figure 9:
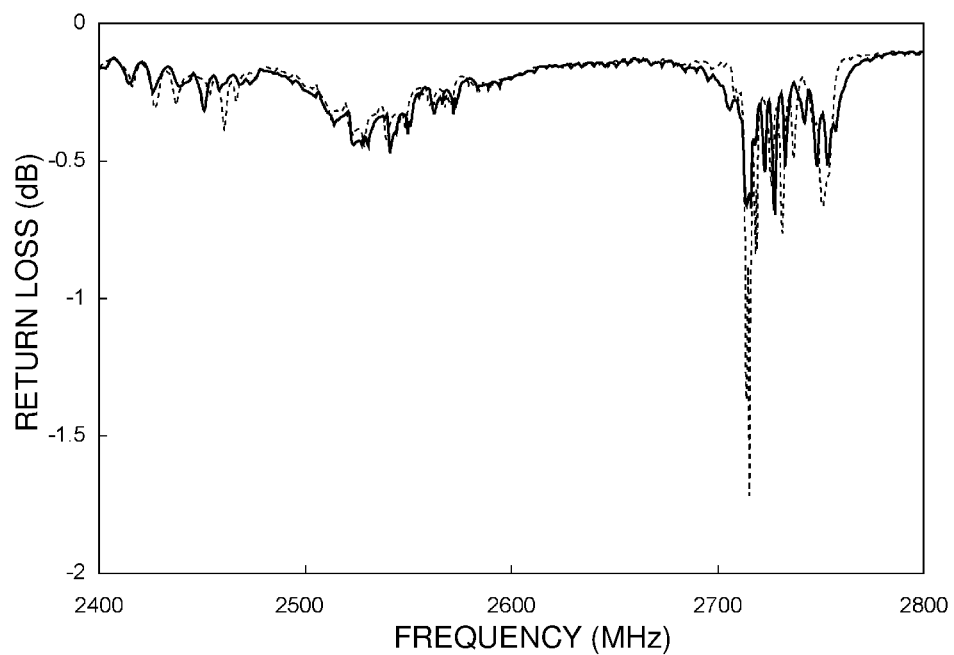
FIG. 9 depicts a return loss of an acoustic wave device according to the fourth preferred embodiment of the present invention and a return loss of an acoustic wave device according to the second comparative example.

FIG. 9 depicts a return loss of the acoustic wave device according to the fourth preferred embodiment and a return loss of the acoustic wave device according to the second comparative example. The solid line indicates the result for the fourth preferred embodiment, and the broken line indicates the result for the second comparative example. The acoustic wave device according to the second comparative example depicted in FIG. 9 is the same or substantially the same as the acoustic wave device according to the second comparative example depicted in FIG. 7.

As depicted in FIG. 9, it can be seen that a stop band response for the fourth preferred embodiment is smaller than a stop band response for the second comparative example.

The reflector 53 and the reflector 56 depicted in FIG. 8 can be formed by using, for example, a lift-off method also in the fourth preferred embodiment. As in the second preferred embodiment, resist patterns corresponding to openings are easily removed, and pattern formation is unlikely to fail.

Figure 10:
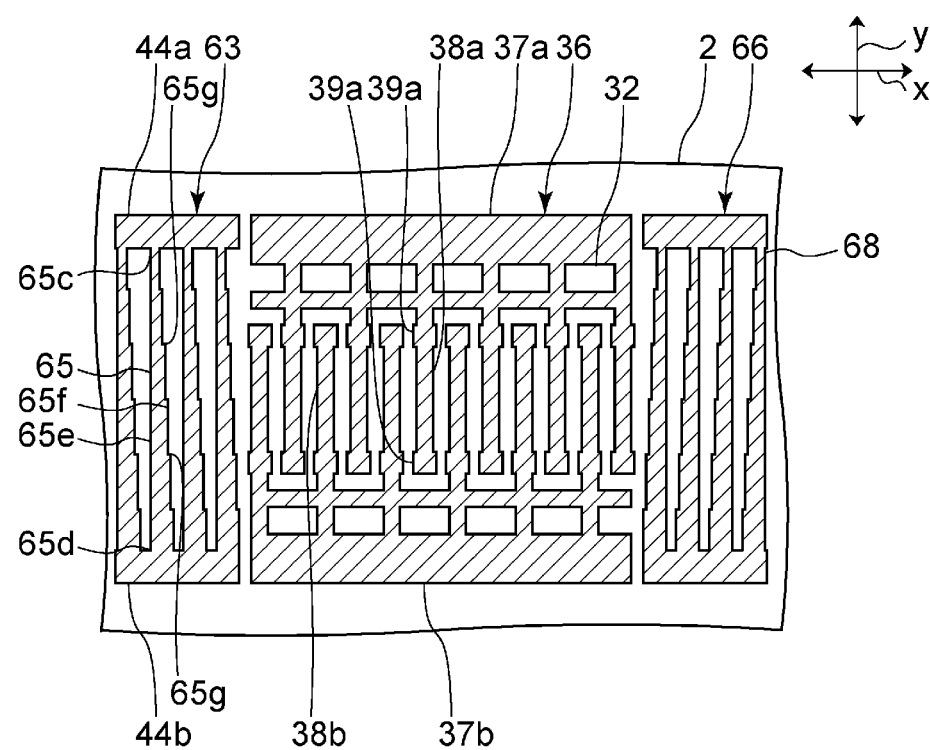
FIG. 10 is a plan view depicting an IDT electrode, reflectors, and the surrounding region according to a fifth preferred embodiment of the present invention.

FIG. 10 is a plan view depicting an IDT electrode, reflectors, and the surrounding region according to a fifth preferred embodiment of the present invention.

The fifth preferred embodiment differs from the third preferred embodiment in that the electrode finger width of a reflector 63 is stepwise increased from a first end portion 65c to a second end portion 65d, and the electrode finger width of a reflector 66 is stepwise increased from a first end portion to a second end portion. An acoustic wave device according to the fifth preferred embodiment has a structure similar to the structure of the acoustic wave device 31 according to the third preferred embodiment except the above feature.

As in the third preferred embodiment, a first side portion 65e of each electrode finger 65 of the reflector 63 extends parallel or substantially parallel to the second direction y. A second side portion 65f has a plurality of steps 65g. The electrode finger width of the reflector 63 is stepwise increased from the first end portion 65c to the second end portion 65d of each of the electrode fingers 65 with steps 65g provided therebetween. Thus, the electrode finger width of a portion located at any given position between the first end portion 65c and the second end portion 65d of each of the electrode fingers 65 is equal to or greater than the electrode finger width of a portion located at a position closer than the given position to the first end portion 65c. A similar description also applies to the reflector 66.

According to the fifth preferred embodiment, the electrode finger width of the reflector 63 does not change in a portion provided between adjacent steps 65g of each of the electrode fingers 65. Each of the second side portions 65f may extend in a direction inclined with respect to the second direction y in a portion provided between adjacent steps 65g, and the electrode finger width may continuously change. Each of the first side portions 65e may also include a plurality of steps 65g.

As in the third preferred embodiment, also in the fifth preferred embodiment, the acoustic wave is reflected at different positions in each portion of the electrode fingers 65 and electrode fingers 68 in the second direction y. This feature can produce a reflection state of the acoustic wave in which a stop band response is reduced. Accordingly, the stop band response of the reflector 63 and the reflector 66 is able to be significantly reduced or prevented.

Figure 11:
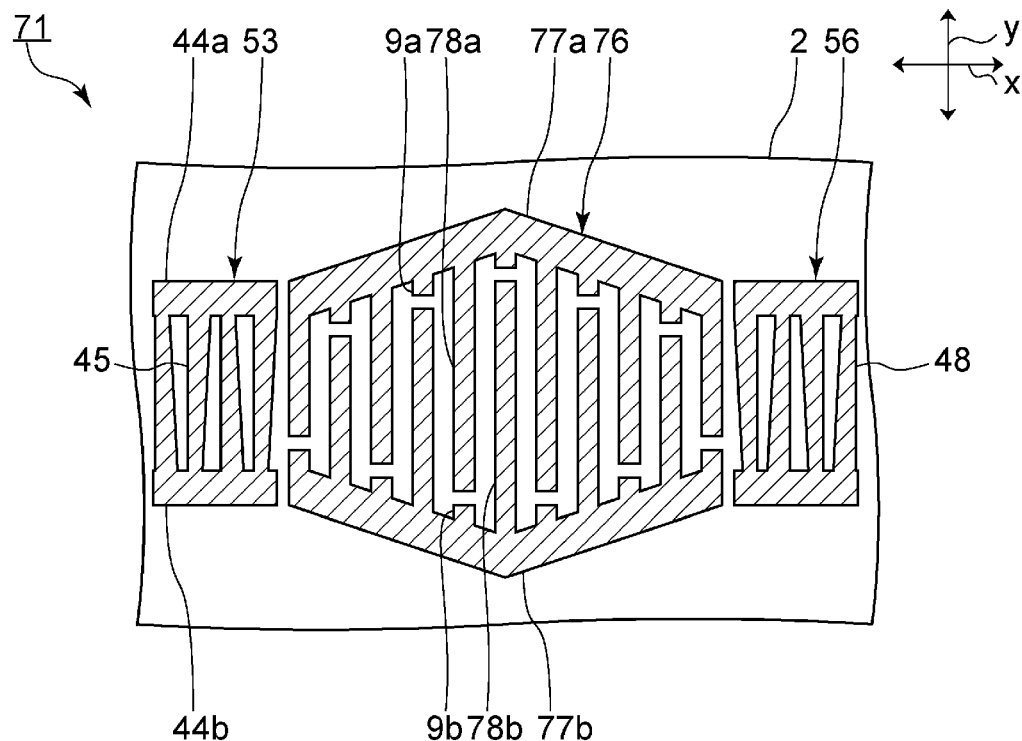
FIG. 11 is a plan view depicting an IDT electrode, reflectors, and the surrounding region according to a sixth preferred embodiment of the present invention.

FIG. 11 is a plan view depicting an IDT electrode, reflectors, and the surrounding region according to a sixth preferred embodiment of the present invention.

The sixth preferred embodiment differs from the fourth preferred embodiment in that an IDT electrode 76 has a different structure. An acoustic wave device 71 according to the sixth preferred embodiment has a structure similar to the structure of the acoustic wave device according to the fourth preferred embodiment except the above feature.

Each of a first busbar 77a and a second busbar 77b of the IDT electrode 76 bends and defines two sides of a rhombic or substantially rhombic shape in plan view. One end of each of the plurality of first dummy electrode fingers 9a and one end of each of a plurality of first electrode fingers 78a are connected to the first busbar 77a. One end of each of the plurality of second dummy electrode fingers 9b and one end of each of a plurality of second electrode fingers 78b are connected to the second busbar 77b. The first electrode fingers 78a and the second electrode fingers 78b decrease in length as the position of an electrode finger becomes more distant from the center of the IDT electrode 76 and closer to the outer edges in the first direction x. Consequently, the overlap width of the IDT electrode 76 decreases as the position becomes more distant from the center of the IDT electrode 76 and closer to the outer edges in the first direction x.

The acoustic wave device 71 includes the reflector 53 and the reflector 56, which are similar to the reflectors in the fourth preferred embodiment. Thus, the acoustic wave is reflected at different positions in each portion of the electrode fingers 45 and the electrode fingers 48 in the second direction y. Accordingly, a stop band response of the reflector 53 and the reflector 56 is able to be significantly reduced or prevented also in the sixth preferred embodiment.

Figure 12:
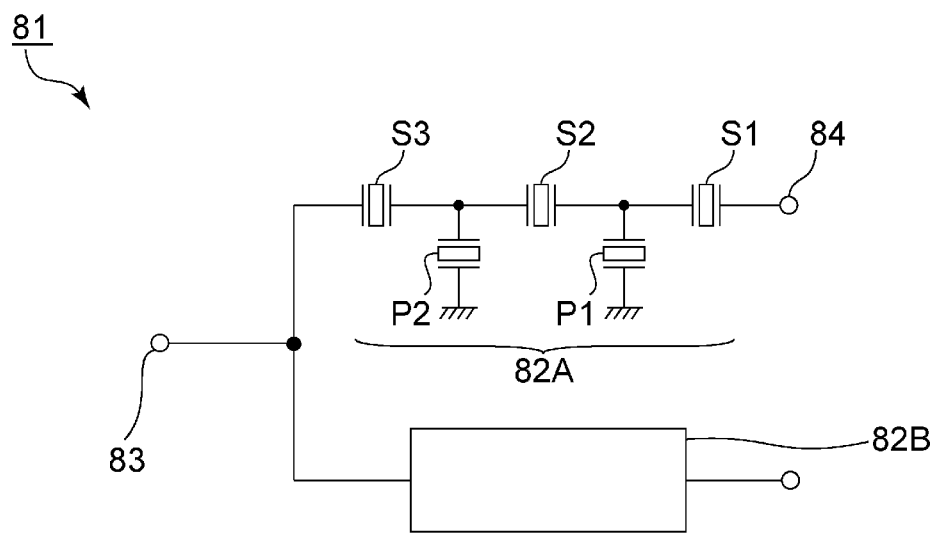
FIG. 12 is a circuit diagram of a composite filter device according to a seventh preferred embodiment of the present invention.

FIG. 12 is a circuit diagram of a composite filter device according to a seventh preferred embodiment of the present invention.

A composite filter device 81 includes an antenna terminal 83 to be electrically connected to an antenna and includes a first band pass filter 82A and a second band pass filter 82B, which define and function as a plurality of filter devices electrically connected to the antenna terminal 83. The composite filter device 81 includes a signal terminal 84 electrically connected to the first band pass filter 82A. The first band pass filter 82A includes a series arm resonator S3 that has a structure similar to the structure of the acoustic wave device 1 according to the first preferred embodiment.

The first band pass filter 82A and the second band pass filter 82B have different pass bands. The first band pass filter 82A and the second band pass filter 82B may be a transmit filter or a receive filter.

The first band pass filter 82A is a ladder filter including a plurality of series arm resonators and a plurality of parallel arm resonators. More specifically, the first band pass filter 82A includes a series arm resonator S1, a series arm resonator S2, and the series arm resonator S3, which are electrically connected between the signal terminal 84 and the antenna terminal 83. A parallel arm resonator P1 is electrically connected between the ground potential and a connecting node between the series arm resonator S1 and the series arm resonator S2. A parallel arm resonator P2 is electrically connected between the ground potential and a connecting node between the series arm resonator S2 and the series arm resonator S3. The circuitry of the first band pass filter 82A is not limited to the features described above.

The circuitry of the second band pass filter 82B, which is depicted as a block, is not particularly specified.

Since the composite filter device 81 includes in the first band pass filter 82A the series arm resonator S3, which has a structure similar to the structure of the acoustic wave device 1 according to the first preferred embodiment, a stop band response of the first band pass filter 82A is able to be significantly reduced or prevented.

As in the seventh preferred embodiment, the series arm resonator S3 is preferably an acoustic wave resonator located closest to the antenna terminal 83, for example. This feature is able to significantly reduce or prevent an effect that is exerted on the second band pass filter 82B by the stop band response of the first band pass filter 82A.

All of the acoustic wave resonators in the first band pass filter 82A may be an acoustic wave resonator that has a structure similar to the structure of any one of the acoustic wave devices according to the first preferred embodiment to the sixth preferred embodiment. The second band pass filter 82B may also include an acoustic wave resonator that has a structure similar to the structure of any one of the acoustic wave devices according to the first preferred embodiment to the sixth preferred embodiment.

Figure 13:
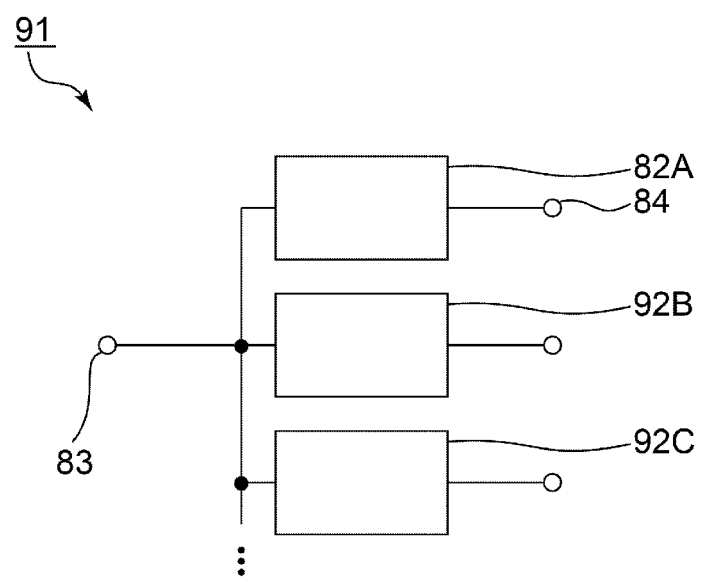
FIG. 13 is a diagram of a composite filter device according to an eighth preferred embodiment of the present invention.

FIG. 13 is a diagram of a composite filter device according to an eighth preferred embodiment of the present invention.

A composite filter device 91 according to the eighth preferred embodiment is a multiplexer. The composite filter device 91 includes the first band pass filter 82A according to the seventh preferred embodiment, which is electrically connected to the antenna terminal 83. The composite filter device 91 includes a second band pass filter 92B and a third band pass filter 92C, which are electrically connected to the antenna terminal 83, to which the first band pass filter 82A is electrically connected. The first band pass filter 82A, the second band pass filter 92B, and the third band pass filter 92C have different pass bands. The composite filter device 91 may include one or more filter devices electrically connected to the antenna terminal 83 in addition to the first band pass filter 82A, the second band pass filter 92B, and the third band pass filter 92C. The number of filter devices electrically connected to the antenna terminal 83 is not particularly specified. The composite filter device 91 can be used for, for example, carrier aggregation.

As in the seventh preferred embodiment, also in the eighth preferred embodiment, a stop band response of the first band pass filter 82A is able to be significantly reduced or prevented. An effect of the stop band response on the second band pass filter 92B, the third band pass filter 92C, and other filter devices, which are electrically connected to the antenna terminal 83, to which the first band pass filter 82A is electrically connected, is able to be significantly reduced or prevented.

The second band pass filter 92B, the third band pass filter 92C, and other filter devices may also include an acoustic wave resonator that has a structure similar to the structure of any one of the acoustic wave devices according to the first preferred embodiment to the sixth preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate;
an interdigital transducer (IDT) electrode on or above the piezoelectric substrate; and
a pair of reflectors on both sides of the IDT electrode in a first direction on the piezoelectric substrate, the first direction being a propagation direction of an acoustic wave; wherein
each of the pair of reflectors includes a plurality of electrode fingers extending in a second direction, the second direction being perpendicular or substantially perpendicular to the first direction;
each of the plurality of electrode fingers includes a first end portion located at one end in the second direction and a second end portion located at the other end in the second direction;

an electrode finger width of the second end portion of each of the plurality of electrode fingers is greater than the electrode finger width of the first end portion, the electrode finger width being a dimension of each of the plurality of the electrode fingers in the first direction; and the electrode finger width at any given position in each of the plurality of electrode fingers is equal to or greater than the electrode finger width at a position closer than the given position to the first end portion.

2. The acoustic wave device according to claim 1, wherein the electrode finger width of each of the plurality of electrode fingers continuously increases from the first end portion to the second end portion.

3. The acoustic wave device according to claim 1, wherein the electrode finger width of each of the plurality of electrode fingers is stepwise increases from the first end portion to the second end portion.

4. The acoustic wave device according to claim 1, wherein a position of the first end portion with respect to a position of the second end portion in the second direction is opposite for the electrode fingers that are adjacent to each other.

5. The acoustic wave device according to claim 1, wherein a position of the first end portion with respect to a position of the second end portion in the second direction is the same or substantially the same for the electrode fingers that are adjacent to each other.

6. The acoustic wave device according to claim 1, wherein the IDT electrode includes a first busbar and a second busbar that face each other and that extend in a direction inclined with respect to the first direction; and each of the pair of reflectors includes a first reflector busbar and a second reflector busbar that face each other, that are connected to the plurality of electrode fingers, and that extend in a direction inclined with respect to the first direction.

7. The acoustic wave device according to claim 1, wherein the IDT electrode includes a first busbar and a second busbar that face each other, a plurality of first electrode fingers connected to the first busbar at one end of each of the plurality of first electrode fingers, and a plurality of second electrode fingers that are connected to the second busbar at one end of each of the plurality of second electrode fingers and that interdigitate with the plurality of first electrode fingers, and the IDT electrode has an overlap area in which the plurality of first electrode fingers and the plurality of second electrode fingers overlap in the first direction;

the overlap area includes a central area located in a central portion in the second direction;

the overlap area includes a first low-acoustic-velocity area located on the first busbar side of the central area and a second low-acoustic-velocity area located on the second busbar side of the central area, and an acoustic velocity in the first low-acoustic-velocity area and an acoustic velocity in the second low-acoustic-velocity area are lower than an acoustic velocity in the central area; and the IDT electrode includes a first high-acoustic-velocity area and a second high-acoustic-velocity area, an acoustic velocity is higher in the first and second high-acoustic-velocity areas than in the central area, the first high-acoustic-velocity area is located on an outer side of the first low-acoustic-velocity area in the second direction, and the second high-acoustic-velocity area is located on an outer side of the second low-acoustic-velocity area in the second direction.

8. The acoustic wave device according to claim 1, wherein the piezoelectric substrate includes a piezoelectric layer including a piezoelectric material, a low-acoustic-velocity layer on or above which the piezoelectric layer is laminated and in which a bulk wave propagates at a lower acoustic velocity than an acoustic velocity of an acoustic wave propagating in the piezoelectric layer, and a high-acoustic-velocity layer on or above which the low-acoustic-velocity layer is laminated and in which a bulk wave propagates at a higher acoustic velocity than the acoustic velocity of the acoustic wave propagating in the piezoelectric layer; and the IDT electrode and the pair of reflectors are on or above the piezoelectric layer.

9. A composite filter device comprising:

an antenna terminal that is electrically connectable to an antenna; and a plurality of filter devices that are electrically connected to the antenna terminal; wherein at least one filter device of the plurality of filter devices includes the acoustic wave device according to claim 1.

10. The composite filter device according to claim 9, wherein the at least one filter device, which includes the acoustic wave device, is a ladder filter that includes a plurality of acoustic wave resonators; and the acoustic wave device is an acoustic wave resonator located closest to the antenna terminal in the filter device among the plurality of acoustic wave resonators.

11. The acoustic wave device according to claim 1, wherein a ratio W1/W2 of the electrode finger width of the first end portion W1 to the electrode finger width of the second end portion W2 is equal to about 0.28 or more and equal to about 0.82 or less.

12. The acoustic wave device according to claim 11, wherein the ratio W1/W2 is equal to about 0.43 or more and equal to about 0.54 or less.

13. The acoustic wave device according to claim 7, wherein the IDT electrode includes a plurality of first dummy electrode fingers and a plurality of second dummy electrode fingers;

one end of each of the plurality of first dummy electrode fingers is connected to the first busbar, and a second end of each of the plurality of first dummy electrode fingers faces one of the plurality of second electrode fingers with a gap provided therebetween; and one end of each of the plurality of second dummy electrode fingers is connected to the second busbar, and a second end of each of the plurality of second dummy electrode fingers faces one of the plurality of first electrode fingers with a gap provided therebetween.

14. The acoustic wave device according to claim 6, wherein an angle of inclination of the first busbar and the second busbar of the IDT electrode is equal to about 7.5°.

15. The acoustic wave device according to claim 6, wherein each of the pair of reflectors includes a plurality of first reflector electrode fingers connected to the first reflector busbar and a plurality of second reflector electrode fingers connected to the second reflector busbar.

16. The acoustic wave device according to claim 15, wherein a reflector electrode width of the plurality of first reflector electrode fingers continuously increases from a first end portion to a second end portion; and a reflector electrode width of the plurality of second reflector electrode fingers continuously increases from a first end portion to a second end portion.

17. The acoustic wave device according to claim 1, wherein the IDT electrode and the pair of reflectors include a laminated metal film in which a plurality of metal layers are laminated or include a single-layer metal film.

* * * * *